(12) United States Patent
Hall

(10) Patent No.: US 7,492,174 B2
(45) Date of Patent: Feb. 17, 2009

(54) TESTING APPARATUS FOR SURFACE MOUNTED CONNECTORS

(76) Inventor: James Hall, 5576 Castle Bar Pl., Alta Loma, CA (US) 91737

( * ) Notice: Subject to any disclaimer, the term of this patent is extended or adjusted under 35 U.S.C. 154(b) by 0 days.

(21) Appl. No.: 11/820,169

(22) Filed: Jun. 18, 2007

(65) Prior Publication Data
US 2008/0309360 A1    Dec. 18, 2008

(51) Int. Cl.
*G01R 31/02*    (2006.01)
*G01R 31/26*    (2006.01)

(52) U.S. Cl. ............... 324/754; 324/758; 324/761; 324/765; 324/755

(58) Field of Classification Search .......... 324/754–765
See application file for complete search history.

(56) References Cited
U.S. PATENT DOCUMENTS

| | | | | |
|---|---|---|---|---|
| 4,771,234 A | * | 9/1988 | Cook et al. | ................. 324/754 |
| 4,977,370 A | * | 12/1990 | Andrews | ................. 324/761 |
| 5,818,248 A | * | 10/1998 | St. Onge | ................. 324/761 |
| 5,883,520 A | | 3/1999 | Delfosse et al. | |
| 5,945,838 A | | 8/1999 | Gallagher et al. | |
| 5,949,243 A | | 9/1999 | Grasso | |
| 6,005,402 A | | 12/1999 | Grasso | |
| 6,130,547 A | * | 10/2000 | Kato | ................. 324/761 |
| 6,194,908 B1 | * | 2/2001 | Wheel et al. | ................. 324/761 |
| 6,407,565 B1 | * | 6/2002 | Sayre et al. | ................. 324/755 |
| 6,847,221 B2 | | 1/2005 | Kimoto et al. | |

* cited by examiner

*Primary Examiner*—Ha Tran T Nguyen
*Assistant Examiner*—Emily Y Chan
(74) *Attorney, Agent, or Firm*—Lewis M. Brande; Thomas A. McCleary; Brande and McCleary

(57) ABSTRACT

This invention describes a device for testing a surface mounted connector using a test probe assembly that utilizes a vacuum to force the test wires and the test probe's wire array into intimate contact with the connector to be tested.

12 Claims, 7 Drawing Sheets

TESTING APPARATUS FOR SURFACE MOUNTED CONNECTORS

BACKGROUND OF THE INVENTION

Automatic test equipment for checking printed circuit boards has long involved the use of "bed of nails" test fixtures on which the circuit board is mounted during testing. A typical test fixture includes a large number of mail-like spring-loaded test probes arranged to make electrical contact between measurement channels in the test equipment and designated test points on the circuit board under test, also referred to as the unit under test or "UUT". Any particular circuit laid out on a circuit board is likely to be different from other circuits, and consequently, the arrangement of the test probes for contacting the respective test points on the circuit board must be specifically customized in a test fixture for that specific circuit board The present invention relates to the testing of surface mounted connectors (SMC), which have been used increasingly on printed circuit boards. This invention has an array of probe pins that can easily contact the connectors of the SMC. The SMC contains an integrated circuit that must be tested while installed on the circuit board. This invention is mounted on a test plate located above a specific SMC. The test probe pins will contact a specific connector of the SMC when a vacuum is applied to a test fixture. The test fixture can be designed to accommodate more than one testing apparatus (i.e. the present invention).

DESCRIPTION

Brief Description of the Prior Art

U.S. Pat. No. 6,194,908 B1 by Wheel et al. describes a "Test Fixture for Testing Backplanes of Populated Circuit Boards". This invention includes a translator fixture having a plurality of spaced translator plates, that are adapted to support a number of translator pins, and a equal number of spring probes that extend through holes in a probe plate that are maintained in electrical contact with the translator pins and translate electrical signals. FIGS. 4 and seven are necessary for the preferred embodiment. Part numbers 134 and 137 are specifically defined as test probes, and are used to make electrical contact with the Unit Under Test "UUT". Even though the test probes are described as either sprung or solid, the common diameter is >1.3 mm, which is substantially greater than the present invention. Additionally, Wheel defines and describes his invention as testing circuit boards that " . . . have contact posts mounted in connectors having sidewalls which extend beyond the ends of the contact posts.". The present invention uses an array of solid wire <0.75 mm in diameter to test individual integrated circuits that are surface mounted, i.e SMU's or surface mounted units. These units are substantially smaller than what can be tested with the device disclosed and described by U.S. Pat. No. 6,194,908.

U.S. Pat. No. 6,005,402 by Grasso describes a "Translator Fixture for use in Circuit Board Testing". This invention shows that the tilt pins (214) contact the test probes (206). The translator fixture (202) has an array of holes and a pin retaining means (250). The pin retaining means creates a friction fit with the tilt pins preventing movement. The present invention by inventor Hall does not have this limitation. In effect, the present invention allows for the movement of the wires within the test fixture. The essential thrust of the '402 patent is the ease of assembly of the translator fixture as opposed to the present invention, which among other things, is dedicated to the unique method of positional alignment of the array of test wires.

U.S. Pat. No. 5,945,838 by Gallagher et al. describes an "Apparatus for Testing Circuit Boards". The translator fixture contains " . . . standard translator pins such as tilt pins . . . extending through holes in the translator plates.". "Preferably the tilt pins are straight, solid conductive pins, and extend through a pin retaining means.". " . . . said plastic screen means apply a partial compression force around the circumference of the translator pins sufficient to retain the translator pins within the test fixture.". The tilt pins contact conductive pins, which are slideably mounted in a guide assembly, which is friction fit into the top plate of the test fixture. The conductive pins are force fit into the block. This patent is somewhat different that the present invention. The present invention allows direct contact of the test wires to the "UUT", where this patent has tilt pins that contact the conductive pins, which in turn contact the "UUT". Additionally, the '838 patent describes the diameters of the conductive pins as greater than 1.372 mm, which is substantially greater than the present invention. Additionally the present invention has direct contact from the spring loaded test probes to the UUT. The '838 patent in effect discloses and describes a different device than the present invention.

SUMMARY OF THE INVENTION

In accordance with the present invention, an apparatus is provided to test SMC's positioned on a circuit board. The apparatus has an array of very small diameter wires that are in contact with translator pins, where the translator pins provide positive resistance and, hence, force intimate contact with the connectors of the SMC when a vacuum is applied to the test fixture.

The apparatus has a series of alignment plates that are arranged in an array parallel to each other and essentially perpendicular to the test probe wires. The alignment plates provide support for the small diameter wires and also guide the array of test probe wires from a wide, "user-friendly" alignment plate at the top of the device to a very small alignment plate at the bottom of the device, where the apparatus connects to the test board above the SMC to test the circuit.

The alignment plate located above the SMC is co-axially aligned with the connectors of the SMC and provide better and more stable connectors to SMC's that are constantly being reduced in size, causing hardship with the manufacturers of the circuit boards. The present invention will eliminate the need to test each SMC on a circuit board individually and allow for simultaneous testing of all the SMC's on the board concurrently. The present invention uses extremely small diameter wire to provide a compact array of test probe wires that is necessary for the current generation of SMC's used in the electronics industry. The present invention is only limited by the ability to manufacture wire and an alignment plate having a sufficient array to properly engage the SMC to be tested.

DETAILED DESCRIPTION OF THE PREFERRED EMBODIMENT

Figure 1:
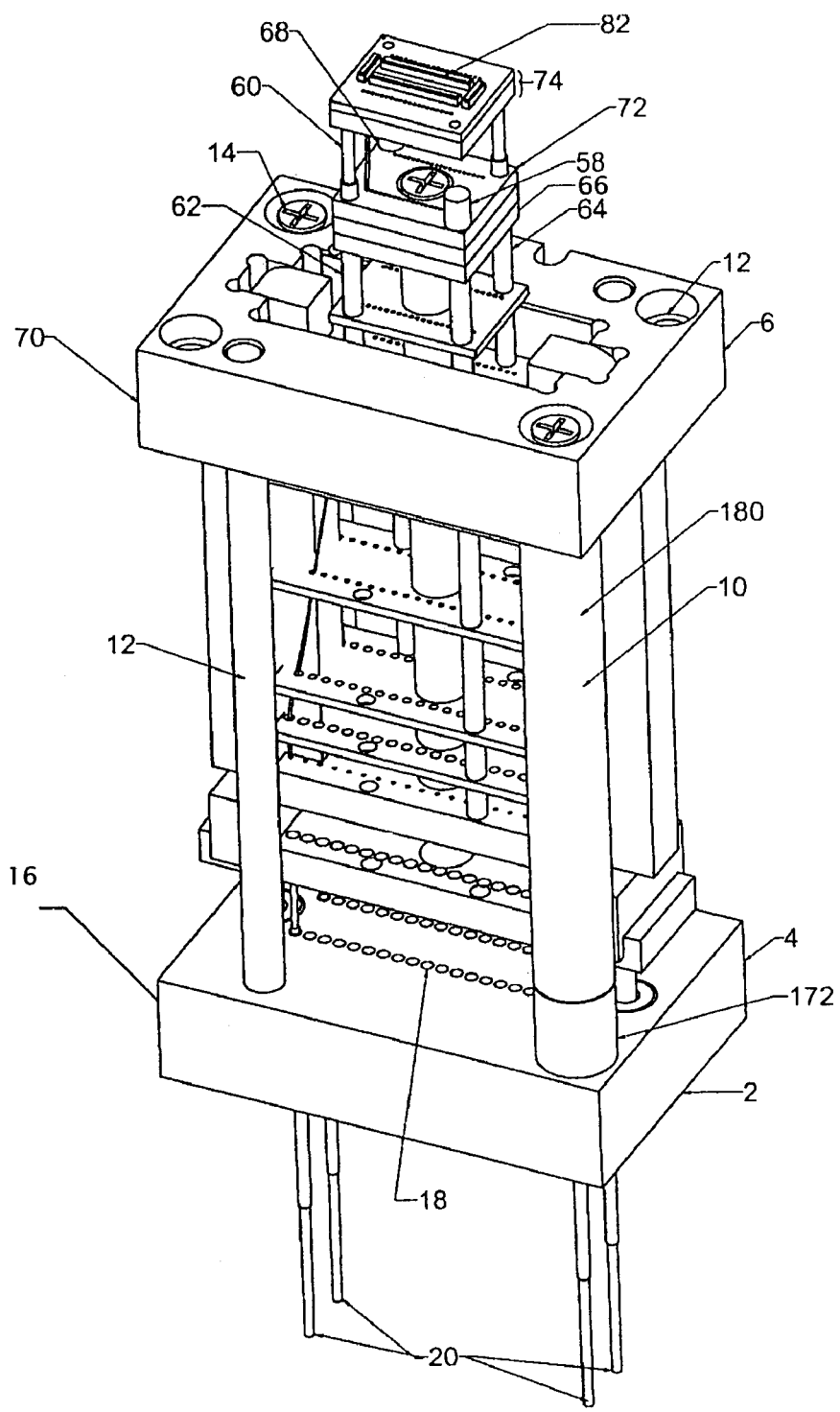
FIG. 1 (one) shows an overall perspective view of the test probe assembly.
Figure 2:
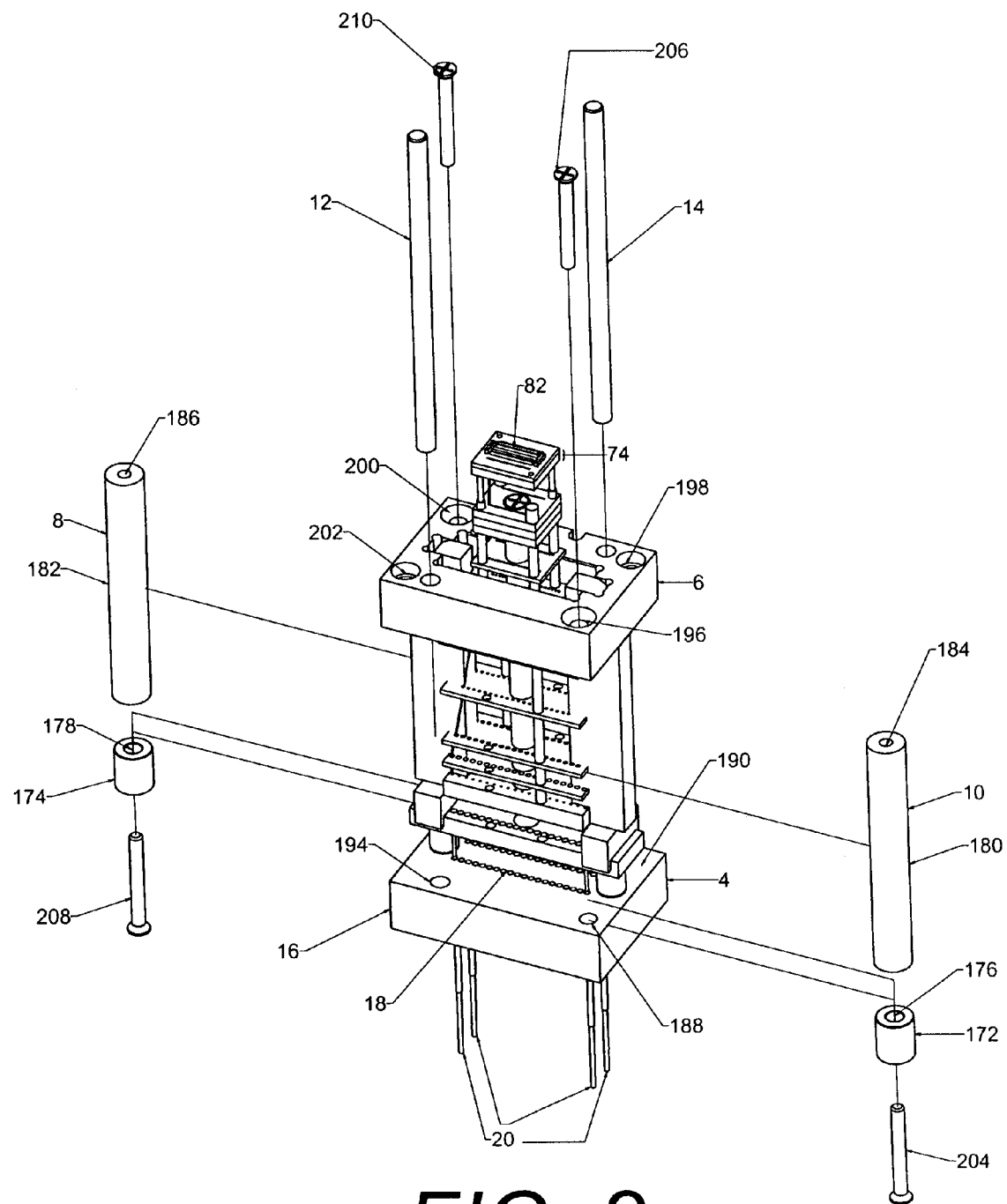
FIG. 2 (two) shows an overall perspective view of the test probe assembly and the composition of the separator bushings and guide rods.
Figure 3:
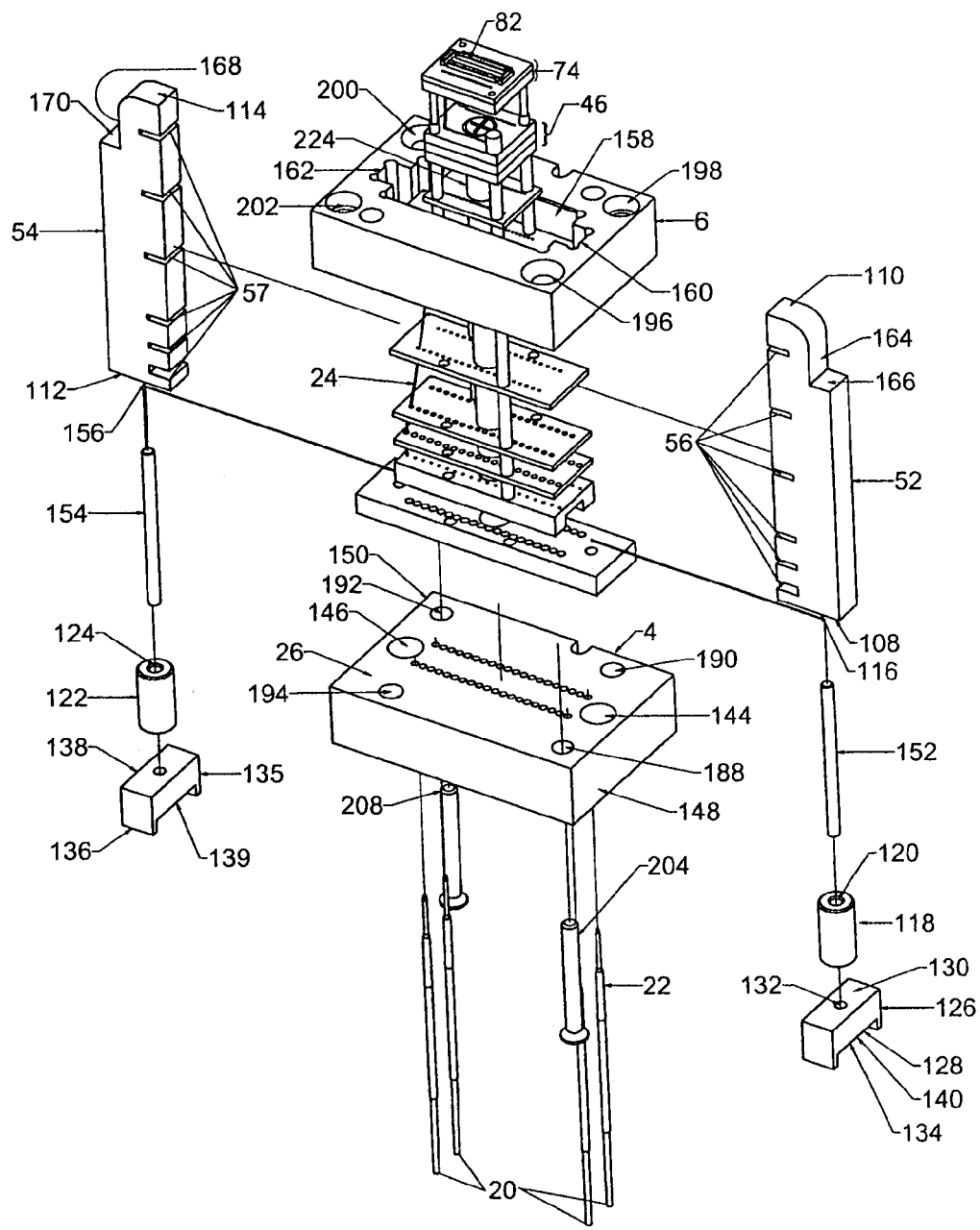
FIG. 3 (three) shows a semi-exploded view of the translating alignment plate assembly showing the alignment bars.
Figure 4:
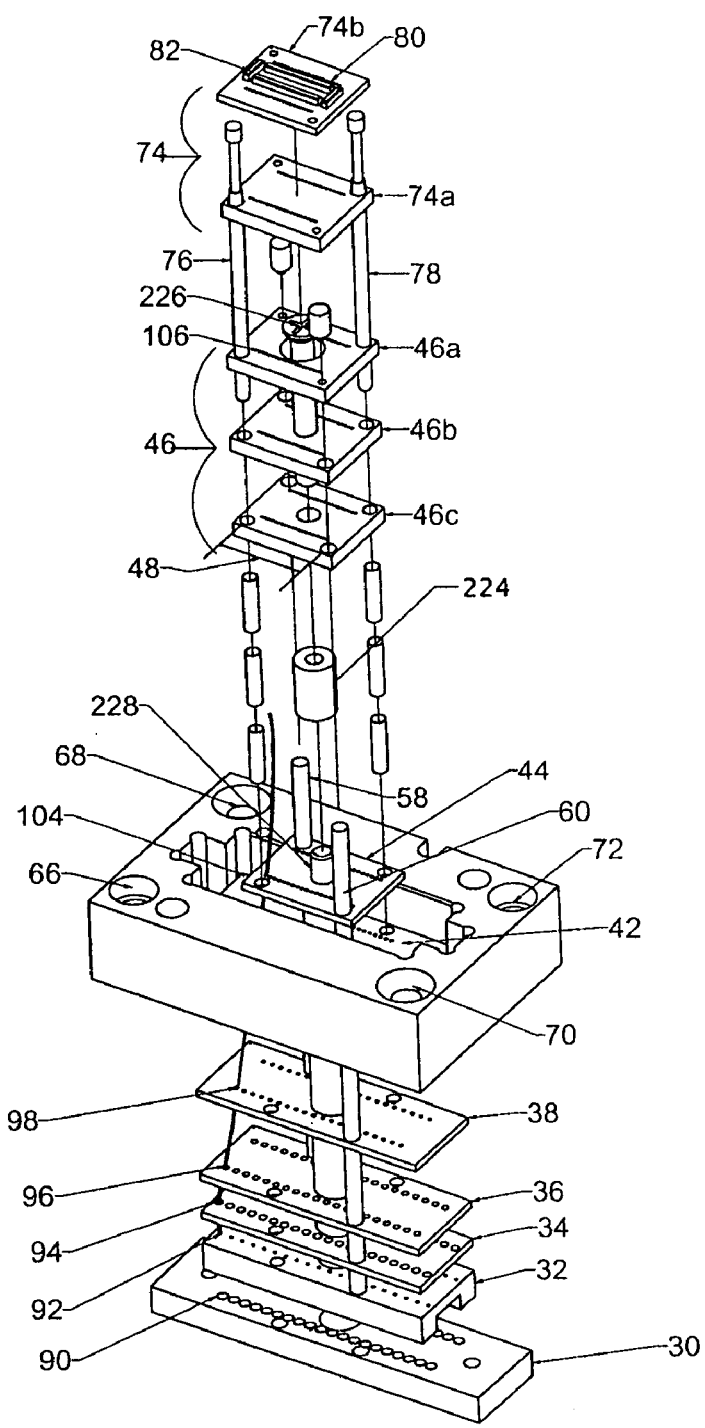
FIG. 4 (four) shows an exploded view of the translating alignment plate assembly and the position of a base plate.
Figure 5:
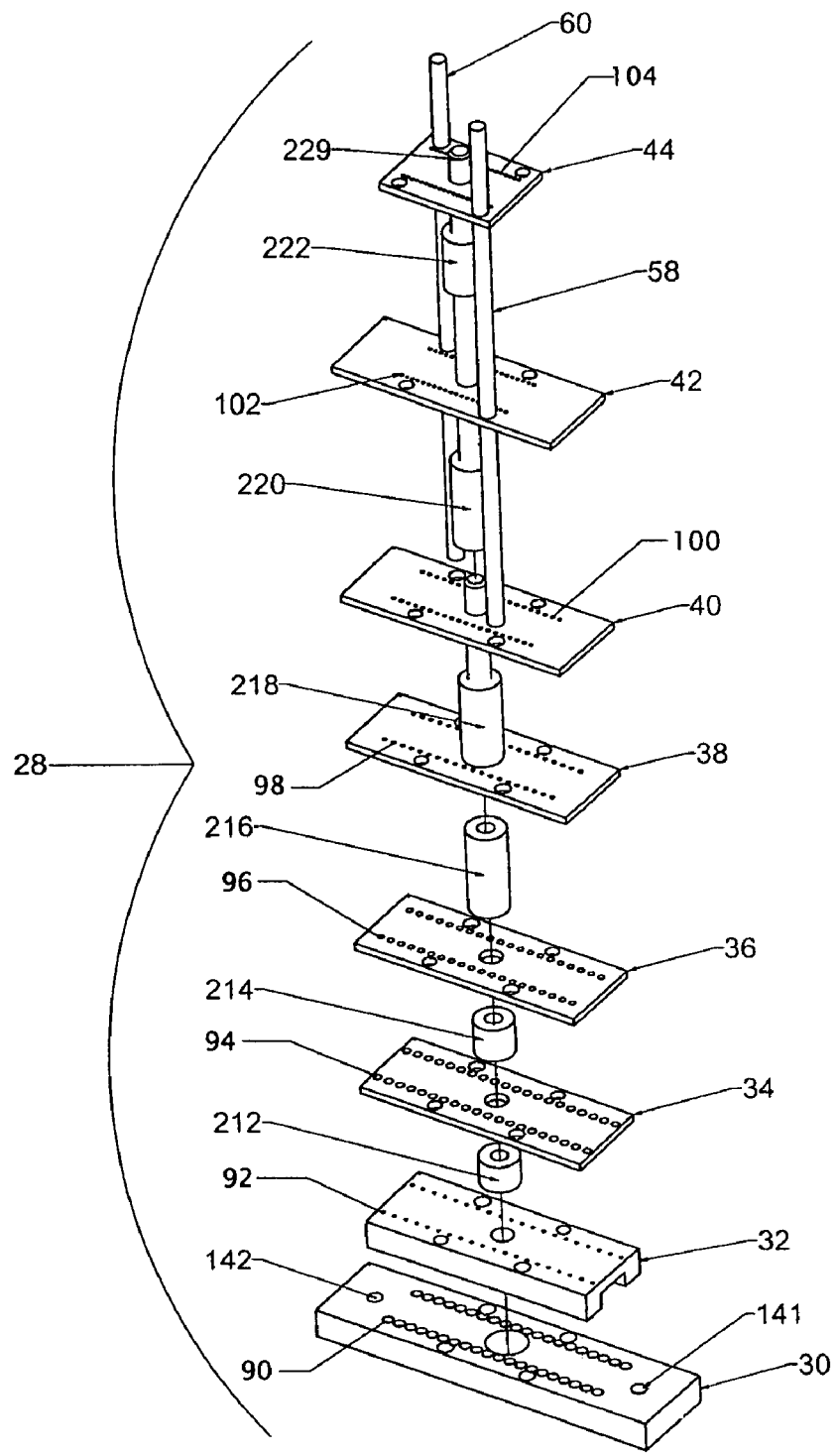
FIG. 5 (five) shows an exploded view of the translating alignment plate assembly.
Figure 6:
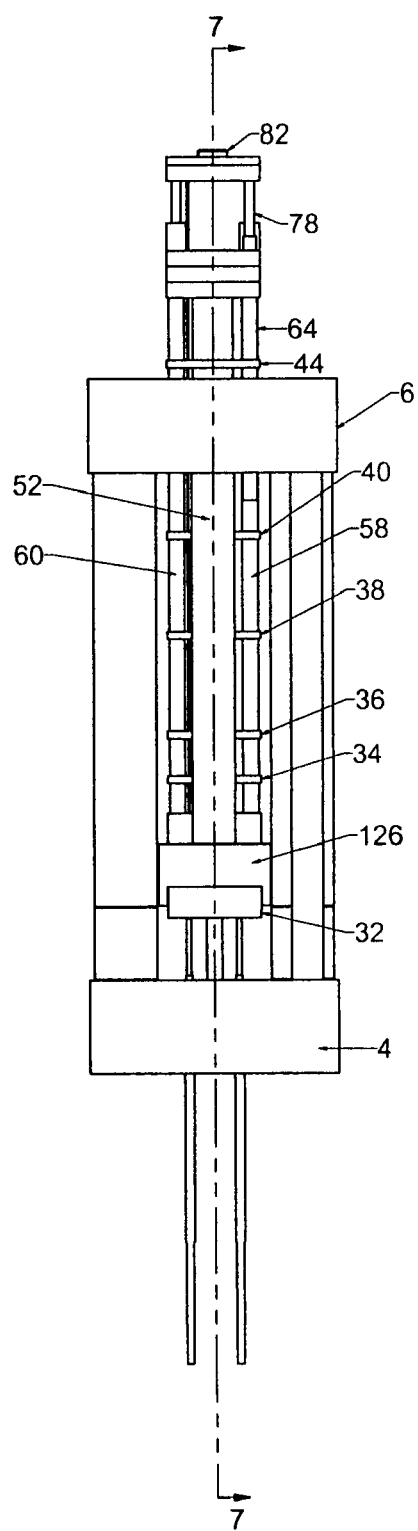
FIG. 6 (six) shows an edge view of the test probe assembly.
Figure 7:
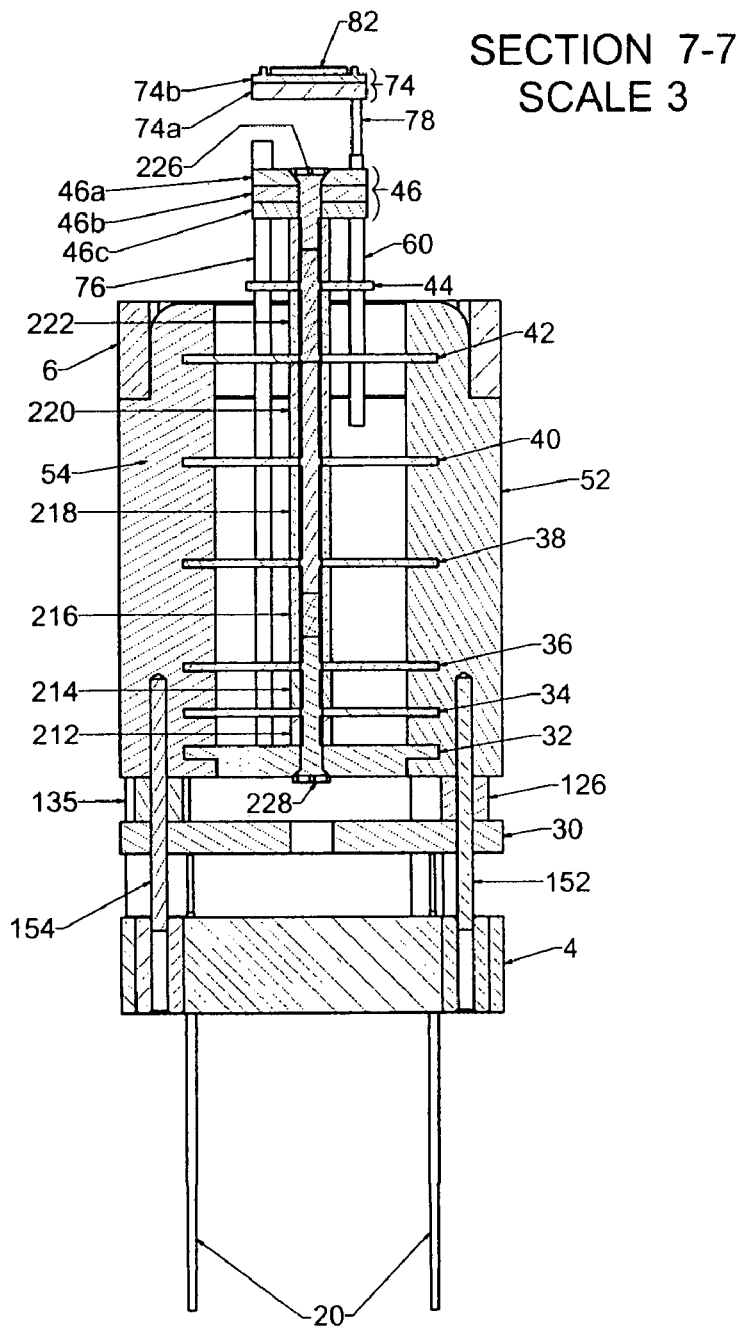
FIG. 7 (seven) shows a cross sectional view of the test probe assembly.

Referring to FIGS. 1-5, a first embodiment of the test probe assembly (2) includes a top plate (4) and a bottom plate (6), where the top plate (4) and bottom plate (6) are essentially rectangular in shape and have four corners. The top plate (4) and the bottom plate (6) have sufficient thickness to provide stability of the test probe assembly (2). The top plate (4) has a first, second, third, and fourth locator hole (188, 190, 192, 194) defined therein, and the bottom plate (6) has a fifth, sixth, seventh, and eighth locator hole (196, 198, 200, 202) defined therein. The first and fifth locator holes (188, 196), the second and sixth locator holes (190, 198), the third and seventh locator holes (192, 200), and the fourth and eighth locator holes (194, 202) are each positionally opposed from each other on the top plate (4) and bottom plate (6) respectively. A first separator bushing (172) and a second separator bushing (174) each has a through hole (176,178) respectively defined therethrough. A third separator bushing (180) and a fourth separator bushing (182) each has a through hole (184, 186) respectively defined therethrough. The first and third separator bushings (172, 180) and the second and fourth separator bushings (174,182) are of equal lengths. The first and third (172, 180) separator bushings and the second and third separator bushings (174,180) bear against each other and define the distance between the top plate (4) and the bottom plate (6). The top plate (4) bears against the second and fourth separator bushings (174, 182), while the bottom plate (6) bears against the first and third separator bushings (172, 180).

A first separator pin or separator bolt (8) is inserted through the first locator hole (188) in the top plate (4), through the first and second separator bushings (172, 174), and is adapted to threadably engage the fifth locator hole (196). A third separator pin or separator bolt (12) is inserted through the third locator hole (192) in the top plate (4), through the third and fourth separator bushings (180, 182) and is adapted to threadably engage the seventh locator hole (200). A second separator pin (10) is frictionally inserted into the second locator hole (190) in the top plate (4) and the sixth (198) locator hole in the bottom plate (6). A fourth separator pin (14) is frictionally inserted into the fourth locator hole (194) in the top plate (4) and the eighth locator hole (202) in the bottom plate (6). The first and third separator bolts (8, 12) may be countersunk in the top plate (4) where each separator pin (8,10,12,14) is located in a corner (16) of the top plate (4) and the bottom plate (6) and provides for angular and distal stability to the test probe assembly (2). A rectangular array of holes (18) is drilled through the top plate (4), and provides an interference fit to an array of spring-loaded test probes (20), where each hole in the rectangular array (18) contains a spring-loaded test probe (20). The spring-loaded test probes (20) are common in the industry. On one end (22) of each test probe (20) a wire (21) is attached. This wire (21) is connected to the test apparatus (not shown). Each spring-loaded test probe (20) is recessed from the bottom (26) of the top plate (4), and allows a corresponding test probe wire (24) to come into intimate contact with the spring-loaded test probe (20). The test probe wire (24) is no greater than 0.008 inch (0.2032 mm) in diameter.

Located between the top plate (4) and the bottom plate (6) is a translating alignment plate assembly (28). An alternative configuration would include a first countersunk bolt (204) that would be inserted through the first locator hole (188) in the top plate (4) into the second separator bushing (174) and threadably engages the first separator bushing (172). A second countersunk bolt (206) is inserted through the fifth locator hole (196) in the bottom plate (6) and also threadably engages the first separator bushing (172). A third countersunk bolt (208) is inserted through the third locator hole (192) in the top plate (4) into the fourth separator bushing (182) and threadably engages the third separator bushing (180). A fourth countersunk bolt (210) is inserted through the seventh locator hole (200) in the bottom plate (6) and also threadably engages the third separator bushing (180).

The translating alignment plate assembly (28) may be made in several different versions to obtain the desired result of compressing the array of test probes (20) into a much smaller array of test probe wires (24) to come into intimate electrical contact with the test specimen. The best process to compress the array of test probe wires (24) is to create a smooth three dimensional spline. The creation of the smooth three dimensional spline allows the test probe wire (24) to easily slide within the translating alignment plate assembly (28), when force is exerted, causing intimate electrical contact with the test specimen, which in turn allows the test fixture to perform the required tests.

The translating alignment plate assembly (28) contains a first alignment plate (30), a second alignment plate (32), a third alignment plate (34), a fourth alignment plate (36), a fifth alignment plate (38), a sixth alignment plate (40), a seventh alignment plate (42), an eighth alignment plate (44) and a ninth alignment plate (46). The first alignment plate (30) has a first array of through holes (90) defined therein, and the second alignment plate (32) has a second array of through holes (92) defined therein, where the first and second array of through holes (90, 92) the first and second array of through holes are parallel and co-incidently positioned and therefore maintain an array of wires (25) in essentially the same orientation and spacing as in the top plate (4). The third through eighth alignment plates (34,36,38,40,42,44) have a third through eighth array of through holes (94,96,98,100,102,104) defined therein, where the third through eighth array of through holes (94,96,98,100,102,104) each consecutively decrease the spatial relationship (gap) of the array (25) of test probe wires (24) until a minimum spatial distance (48) has been achieved. The ninth alignment plate (46) has a ninth array of through holes (106) defined therein, where the ninth array of through holes (106) are arrayed at a minimum required distance (48). The first through ninth array of through holes (90, 92, 94,96,98, 100,102,104, 106) each acts as a singular point on a spline, where the first through ninth array of through holes (90, 92, 94,96,98,100,102,104, 106) all in conjunction with each other create a smooth three dimensional spline for each test probe wire (24), which permits an easy, smooth, and kink free motion for each of the test probe wires (24) in the test probe wire array (25).

The ninth alignment plate (46) additionally has a thickness that provides stability to the test probe wire array (25). The minimum required distance (48) is based upon the SMC's (50) to be tested, which ultimately defines the test probe wire's (24) diameter and number. In this particular embodiment, the ninth alignment plate (46) is an assembly comprising a first sub-plate (46*a*) a second sub-plate (46*b*), and a third sub-plate (46*c*), where each sub-plate (46*a*, 46*b*, 46*c*) is of the same shape and thickness, and has the same array of through holes (106).

The translating alignment plate assembly (28) also contains a first (52) and second (54) alignment bar. The first alignment bar (52) has a first set of slots defined therein (56), the second alignment bar (54) has a second set of slots (57) defined therein, the first and second set of slots (56, 57) are positioned in a parallel relationship and are designed rigidly hold the second through sixth alignment plates (32,34,36,38, 40). The first and second set of slots (56,57) in each alignment bar (52,54) are positionally opposed to each other. The second through eighth alignment plate (32,34,36,38,40,42,44) each has four parallel guide rods (58,60,62,64) positioned to rigidly hold the second through eight alignment plate (32,34,36, 38,40,42,44). The positional location of the guide rods (58, 60,62,64) is defined by the shape and size of the eighth alignment plate (44) and ninth alignment plate (46).

The first alignment bar (52) has a first top side (108) and a first bottom side (110), and the second alignment bar (54) has a second top side (112) and a second bottom side (114). The first top side (108) of the first alignment bar (52) has a central hole (116) defined therein, and the second top side (112) of the second alignment bar (54) has a central hole (156) defined therein. A first bushing (118) has a first through hole (120) defined therethrough, and a second bushing (122) has a second through hole (124) defined therethrough.

A first spacer block (126) is generally rectangular in shape. The first spacer block (126) has a top side (128) and a bottom side (130). The first spacer block (126) additionally has a third through hole (132) defined therethrough, where the third through hole (132) penetrates the top side (128) and the bottom side (130) of the first spacer block (126). The bottom side (130) of the first spacer block (126) additionally has a first groove (134) defined therein, where the first groove (134) is adapted to allow the first alignment plate (30) to snugly fit therein.

A second spacer block (135) is generally rectangular in shape. The second spacer block (135) has a top side (136) and a bottom side (138). The second spacer block (134) additionally has a fourth through hole (140) defined therethrough, where the fourth through hole (140) penetrates the top side (136) and the bottom side (138) of the second spacer block (135). The bottom side (138) of the second spacer block (135) additionally has a second groove (139) defined therein, where the second groove (139) is adapted to allow the first alignment plate (30) to snugly fit therein.

The first alignment plate (30) is generally rectangular in shape and has a fifth through hole (141) and a sixth through hole (142) defined therein. The fifth and sixth through holes (140, 142) are positionally opposed to each other and centrally located towards the edges of the first alignment plate (30). The top plate (4) has a fifth through hole (144) and a sixth through hole (146) defined therein, where the fifth and sixth through holes (144, 146) are positionally located towards the short edges (148, 150) of the top plate (4). The fifth and sixth through holes (144, 146) have a diameter that allows the first bushing (118) and the second bushing (122) to be positioned therein. The first bushing (118) and the second bushing (122) may be frictionally fit therein, glued, or welded to prevent the first bushing (118) and the second bushing (122) from moving.

A first dowel pin (152) is inserted into the central hole (116) of the first top side (108) of the first alignment bar (52). The first dowel pin (152) additionally is fit through the third through hole (132) of the first spacer block (126), where the top side (128) of the first spacer block (126) bears against the first top side (108) of the first alignment bar (52). A second dowel pin (154) is fit through the central hole (156) of the second top side (112) of the second alignment bar (54). The second dowel pin (154) is additionally fit through the fourth through hole (140) of the second spacer block (135), where the top side (136) of the second spacer block (135) bears against the second top side (112) of the second alignment bar (54). The first dowel pin (152) is inserted through the fifth through hole (141) of first alignment plate (30) and the second dowel pin (154) is inserted through the sixth through hole (142) of the first alignment plate (30). The first alignment plate (30) is positioned in the first groove (134) of the first spacer block (126) and the second groove (139) of the second spacer block (135). The first dowel pin (152) is then frictionally inserted into the first through hole (120) of the first bushing (118) essentially positioning the first alignment bar (52). The second dowel pin (154) is frictionally inserted into the second through hole (124) of the second bushing (122), positioning the second alignment bar (54).

The bottom plate (6) has a rectangular groove (158) centrally defined therein. The bottom plate (6) additionally has a second groove (160) and a third groove (162) defined therein. The second and third groove (160,162) are positionally opposed to each other and allow the first and second alignment bars (52,54) to respectfully fit therethrough. The first bottom (110) side of the first alignment bar (52) is shaped to allow a first flat (164) to slide within the second groove (160) of the bottom plate (6). A second flat (166) of the first alignment bar (52) bears against the bottom plate (6) and acts as a stop for the first alignment bar (52). The second bottom side (114) of the second alignment bar (54) is shaped to allow a third flat (168) to slide within the third groove (162) of the bottom plate (6). A fourth flat (170) of the second alignment bar (54) bears against the bottom plate (6) and acts as a stop for the second alignment bar (54). This effectively defines a parallel translating relationship between the translating plate assembly (28) and the top and bottom plates (4, 6).

The ninth alignment plate (46) is essentially rectangular in shape and has four corners (66,68,70,72). A first and third guide rod (58, 62) are each located in opposing corners (66, 70) of the ninth alignment plate (46) a second and fourth guide rod (60, 64) are each located in opposing corners (68, 72) of the ninth alignment plate (46). The second and fourth guide rods (60, 64) are sprung loaded and extend beyond the ninth alignment plate (46) and attach to opposing corners of a tenth alignment plate or test probe connector plate (74). Each guide rod (58,60,62,64) is positioned in a parallel relationship to each other. The first and third guide rod (58, 62) extend through the second through ninth alignment plates (32, 34,36, 38,40,42,44,46), while the second and fourth guide rods (60, 64) extend only through the seventh through ninth alignment plates (42, 44, 46). A fifth guide rod (76) is positioned through the second through sixth alignment plates (32, 34, 36, 38, 40) and axially parallel to the second guide rod (60). A sixth guide rod (78) is positioned through the second through sixth alignment plates (32, 34, 36, 38, 40) and axially parallel to the fourth guide rod (64). The first (58), second (60), third (62), fourth (64), fifth (76), and sixth (78) guide rods, each as an array, provides stiffness to the second through ninth alignment plates (32,34,36,38,40,42,44,46) and thereby prevents the alignment plates (32,34,36,38,40,42,44,46) from deflecting during a test. A fifth bushing (212) is centrally located between the second and third alignment plates (32, 34), a sixth bushing (214) is centrally located between the third and fourth alignment plates (34, 36), a seventh bushing (216) is centrally located between the fourth and fifth alignment plates (36, 38), an eighth bushing (218) is centrally located between the fifth and sixth alignment plates (38, 40), a ninth bushing (220) is centrally located between the sixth and seventh alignment plates (40, 42), a tenth bushing (222) is centrally located between the seventh and eighth alignment plates (42, 44), and an eleventh bushing (224) is centrally located between the eighth and ninth alignment plates (44, 46). The fifth through eleventh bushings (212 through 224) each eliminate any gap between their respective alignment plates (32 through 46). A fifth countersunk bolt (226) is inserted through the ninth through seventh alignment plates (46, 44, 42) and through the eleventh through ninth bushings (224, 222, 220) and is adapted to threadably engage in the eighth bushing (218). A sixth countersunk bolt (228) is inserted through the second through sixth alignment plates (32,34,36,38, 40) and through the fifth through seventh bushing (212, 214, 216) and is adapted to threadably engage in the eighth bushing (218) thereby locking the alignment plates (32,34,36,38, 40) in a fixed position.

The tenth alignment plate or test probe connector plate (74) is distally spaced from the ninth alignment plate (46) by the second guide rod (60) and fourth (64) guide rods. The tenth alignment plate or test probe connector plate (74) is located in the same parallel relationship as the first through ninth alignment plates (30,32,34,36,38,40,42,44,46), and contains a tenth array of through holes (80) defined therein. The tenth array of through holes (80) has an identical orientation and parallel relationship as the ninth array of through holes (106). This provides a consistent method of maintaining the group of test probe wires (24) in the proper orientation within the array (25).

The tenth alignment plate or test probe connector plate (74) has a first sub-plate (74a) and a second sub-plate (74b). The second sub-plate (74b) has a central boss (82) defined thereon, where the central boss (82) is designed to intimately mate with a connector (84), the connector (84) being located on a test plate (86). The central boss (82) on the tenth alignment plate or test probe connector plate (74) is adapted to mate into a corresponding recess (88) in the connector (84) on the test plate (86) which is located above the SMC (50) to be tested.

The test probe wire array (25) does not normally protrude from the tenth alignment plate (74) but is actually offset into the body of the tenth alignment plate (74) to protect the test probe wire array (25) from damage when not in use. When vacuum is applied to the test plate (86), the test probe assembly (2) operates using a two stroke system. The vacuum causes the test plate (86) to move towards the SMC (50). The second (60) and fourth (64) spring-loaded guide rods have a low enough spring rate to allow the test probe wires (24) and essentially the test probe wire array (25) to protrude through the tenth alignment plate or test probe connector plate (74) and contact the corresponding connectors on the SMC (50) (first stroke). Intimate contact is maintained by the array of spring loaded test probes (20) (second stroke), which has a higher spring rate than the second and fourth guide rods (60,64).

An alternative embodiment to the translating plate assembly (28) is the use of three (3) or more plates, where the plates have the spline shape etched into corresponding faces of the plates, and provide a smooth 3 dimensional groove at the tip similar to the disclosed embodiment.

Although the foregoing includes a description of the best mode contemplated for carrying out the invention, various modifications are contemplated.

As various modifications could be made in the constructions herein described and illustrated without departing from the scope of the invention, it is intended that all matter contained in the foregoing description or shown in the accompanying drawings shall be interpreted as illustrative rather than limiting.

What is claimed is:

1. What is claimed is a device for testing surface connectors comprising:
  a. a top plate and a bottom plate, said top plate and said bottom plate are each essentially rectangular in shape and have four corners, said top plate and said bottom plate each have sufficient thickness to provide stability to a test probe assembly, said top plate has a first, second, third and a fourth locator hole defined therein, said bottom plate has a fifth, a sixth, a seventh, and an eighth locator hole defined therein, said first and said fifth locator holes, said second and said sixth locator holes, said third and said seventh locator holes, and said fourth and said eighth locator holes are each positionally opposed to each other on said top plate and said bottom plate, said top plate and said bottom plate are maintained distally apart by a first, a second, a third and a fourth separator bushing each of said bushings has a through hole respectively defined therethrough, said first and said third separator bushings and said second and said fourth separator bushings are of equal lengths, said first and said third separator bushings and said second and said fourth separator bushings bear against each other and define the distance between said top plate and said bottom plate, said top plate bears against said second and said fourth separator bushings, while said bottom plate bears against said first and said third separator bushings;
  b. a first separator pin or separator bolt is inserted through said first locator hole in said top plate, through said first and said second separator bushings and is adapted to threadably engage said fifth locator hole, a third separator pin is inserted through said third locator hole in said top plate through said third and said fourth separator bushings and is adapted to threadably engage said seventh locator hole, a second separator pin is frictionally inserted into said second locator hole in said top plate and said sixth locator hole in said bottom plate, a fourth separator pin is frictionally inserted into said fourth locator hole in said top plate and said eighth locator hole in said bottom plate, said first and said third separator bolts are countersunk in said top plate where each said separator pin is located in a corner of said top plate and said bottom plate and provides for angular and distal stability to said test probe assembly, a rectangular array of holes is drilled through said top plate, said rectangular array of holes provides an interference fit to an array of spring-loaded test probes, each of said holes in said rectangular array contains a spring-loaded test probe, one end of each of said test probe is adapted to receive a wire, said wire is adapted to connect to a test apparatus, each of said spring-loaded test probe is positionally recessed from said bottom of said top plate and allows a corresponding test probe wire to come into intimate electrical contact with said spring-loaded test probe, a translating alignment plate assembly is positionally located between said top plate and said bottom plate;
  c. said translating alignment plate assembly contains a first, a second, a third, a fourth, a fifth, a sixth, a seventh, an eighth, and a ninth alignment plate, said first alignment plate has a first array of through holes defined therein, and said second alignment plate has a second array of through holes defined therein, said second array of through holes are parallel and co-incidently positioned, said first and said second array of through holes therefore maintain an array of wires in essentially the same orientation and spacing as in said top plate, said third through eighth alignment plates have a third through eighth array of through holes defined therein, where said third through eighth array of through holes each consecutively decrease a spatial relationship (gap) of said array of test probe wires until a minimum spatial distance has been achieved, said ninth alignment plate has a ninth array of through holes defined therein, where said ninth array of through holes is arrayed at a minimum required distance, each hole within said first through ninth array of through holes each acts as a singular point on a spline, where said first through ninth array of through holes, all in conjunction with each other, create a smooth three dimensional spline for each test probe wire, providing a smooth and kink free motion for each of said test probe wires in said test probe wire array;

d. said ninth alignment plate additionally has a thickness, said thickness provides stability to said test probe wire array, said minimum required distance of said test probe wire array is defined by the SMC's to be tested, said ninth alignment plate is an assembly comprising a first sub-plate, a second sub-plate, and a third sub-plate, where each of said sub-plates is of the same shape and thickness, said first sub-plate, said second sub-plate, and said third sub-plate each has an array of through holes defined therein, each of said array of through holes are parallel and co-incidently positioned;

e. said translating alignment plate assembly also has a first and second alignment bar, said first alignment bar has a first set of parallel slots defined therein, said second alignment bar has a second set of parallel slots defined therein, said first and said second set of parallel slots are designed to rigidly hold said second through said sixth alignment plates, said first and said second set of parallel slots in each alignment bar are positionally opposed to each other, said second through said eighth alignment plate each has four parallel guide rods positioned to rigidly hold said second through said eighth alignment plate, said positional location of said guide rods is defined by the shape and size of said eighth and said ninth alignment plate;

f. said first alignment bar has a first top side and a first bottom side, and said second alignment bar has a second top side and a second bottom side, said first top side of said first alignment bar has a central hole defined therein, and said second top side of said second alignment bar has a central hole defined therein, a first bushing has a first through hole defined therethrough, and a second bushing has a second through hole defined therethrough;

g. a first spacer block has a top side and a bottom side, said first spacer block has a third through hole defined therethrough, where said third through hole penetrates said top side and said bottom side of said first spacer block, said bottom side of said first spacer block has a first groove defined therein, said first groove is adapted to allow said first alignment plate to snugly fit therein;

h. a second spacer block has a top side and a bottom side, said second spacer block has a fourth through hole defined therethrough, where said fourth through hole penetrates said top side and said bottom side of said second spacer block, said bottom side of said second spacer block has a second groove defined therein, said second groove is adapted to allow said first alignment plate to snugly fit therein;

i. said first alignment plate has a fifth through hole and a sixth through hole defined therein, said fifth and said sixth through holes are positionally opposed to each other and are centrally biased towards the edges of said first alignment plate, said top plate has a fifth through hole and a sixth through hole defined therein, where said fifth and said sixth through holes are positionally biased towards said short edges of said top plate, said fifth and said sixth through holes have a diameter that allows said first bushing and said second bushing to be positioned therein;

j. a first dowel pin is inserted into said central hole of said first top side of said first alignment bar, said first dowel pin is inserted through said third through hole of said first spacer block, where said top side of said first spacer block bears against said first top side of said first alignment bar, a second dowel pin is inserted through said central hole of said second top side of said second alignment bar, said second dowel pin is inserted through said fourth through hole of said second spacer block, where said top side of said second spacer block bears against said second top side of said second alignment bar, said first dowel pin is inserted through said fifth through hole of said first alignment plate and said second dowel pin through said sixth through hole of said first alignment plate, said first alignment plate is positioned in said first groove of said first spacer block and said second groove of said second spacer block, said first dowel pin is frictionally inserted into said first through hole of the said first bushing positioning said first alignment bar, said second dowel pin is frictionally inserted into said second through hole of said second bushing, positioning said second alignment bar;

k. said bottom plate has a rectangular groove centrally defined therein, said bottom plate has a second groove and a third groove defined therein, said second and said third groove are positionally opposed to each other and allow said first and said second alignment bars to be inserted therethrough, said first bottom side of said first alignment bar is shaped to allow a first flat to slide within said second groove of said bottom plate, a second flat of said first alignment bar bears against said bottom plate and acts as a stop for said first alignment bar, said second bottom side of said second alignment bar is shaped to allow a third flat to slide within said third groove of said bottom plate, a fourth flat of said second alignment bar bears against said bottom plate and acts as a stop for said second alignment bar, said ninth alignment plate is essentially rectangular in shape and has four corners, a first and a third guide rod are each located in opposing corners of said ninth alignment plate, a second and fourth guide rod are each located in opposing corners of said ninth alignment plate, said second and said fourth guide rods are spring loaded and extend beyond said ninth alignment plate and attach to opposing corners of a tenth alignment plate, each guide rod is positioned in a parallel relationship to each other, said first and said third guide rods extend through said second through said ninth alignment plates, while said second and said fourth guide rods extend only through said seventh through said ninth alignment plates, a fifth guide rod is positioned through said second through said sixth alignment plates, said fifth guide rod is axially parallel to said second guide rod, a sixth guide rod is positioned through said second through said sixth alignment plates and is axially parallel to said fourth guide rod, said first, said second, said third, said fourth, said fifth, and said sixth guide rods, provide stiffness to said second through said ninth alignment plates thereby preventing deflection of said alignment plates during a test;

l. a fifth bushing is centrally located between said second and third alignment plates, a sixth bushing is centrally located between said third and said fourth alignment plates, a seventh bushing is centrally located between said fourth and said fifth alignment plates, an eighth bushing is centrally located between said fifth and said sixth alignment plates, a ninth bushing is centrally located between said sixth and said seventh alignment plates, a tenth bushing is centrally located between said seventh and said eighth alignment plates, and an eleventh bushing is centrally located between said eighth and said ninth alignment plates, said fifth through said eleventh bushings are adapted to eliminate gaps between said respective alignment plates, a fifth countersunk bolt is inserted through said ninth through said seventh alignment plates and through said eleventh through said ninth bushings and is adapted to threadably engage in said eighth bushing, a sixth countersunk bolt is inserted through said second through said sixth alignment plates and through said fifth through said seventh bushing and is adapted to threadably engage in said eighth bushing, locking said alignment plates in a fixed position thereby;

m. said tenth alignment plate is distally spaced from said ninth alignment plate by said second and said fourth guide rods, said tenth alignment plate is located in said same parallel relationship as said first through said ninth alignment plates and contains a tenth array of through holes defined therein, said tenth array of through holes has an identical orientation and parallel relationship as said ninth array of through holes, providing a consistent method of maintaining said group of test probe wires in said proper orientation within said array;

n. said tenth alignment plate has a first sub-plate and a second sub-plate, said second sub-plate has a central boss defined thereon, where said central boss is adapted to intimately mate with a connector, said connector being located on a test plate, said central boss on said tenth alignment plate is adapted to mate into a corresponding recess in said connector on said test plate, which is located above the SMC to be tested;

o. whereby when a vacuum is applied to said test plate, said test probe assembly operates using a two stroke system, the vacuum causes said test plate to move towards the SMC, said second and said fourth spring-loaded guide rods have a low enough spring rate to allow said test probe wires to penetrate through said tenth alignment plate and contact said corresponding connectors on the SMC (first stroke), and intimate contact is maintained by said array of spring loaded test probes (second stroke), which has a higher spring rate than said second and said fourth guide rods maintaining intimate electrical contact.

2. The device for testing surface connectors of claim 1, wherein said test probe wire has a diameter no greater than 0.008 inch. (0.2032 mm).

3. What is claimed is a device for testing surface connectors comprising:

a. a top plate and a bottom plate, said top plate and said top plate and said bottom plate each have sufficient thickness to provide stability to a test probe assembly, said top plate has a plurality of locator holes defined therein, said bottom plate has a plate has a plurality of locator holes defined therein, said plurality of locator holes in said top plate are positionally opposed to said plurality of locator holes in said bottom plate, said top plate and said bottom plate are maintained distally apart by a plurality of separator bushings, said separator bushings maintain said top plate and said bottom plate distally apart, said top plate and said bottom plate bear against said separator bushings;

b. a plurality of separator pins are each inserted through said plurality of locator holes in said top plate, said plurality of separator bushings and said plurality of locator holes in said bottom plate, and fixedly attach said top plate to said bottom plate, a array of holes is drilled through said top plate, said array of holes provides an interference fit to an array of spring-loaded test probes, each of said holes in said array contains a spring-loaded test probe, one end of each of said test probe is adapted to receive a wire, said wire is adapted to connected to a test apparatus, each of said spring-loaded test probe is positionally recessed from said bottom of said top plate and allows a corresponding test probe wire to come into intimate electrical contact with said spring-loaded test probe, a translating alignment plate assembly is positionally located between said top plate and said bottom plate;

c. said translating alignment plate assembly contains a first plurality of alignment plates, said first plurality of alignment plates each has an array of through holes defined therein, said first plurality of alignment plates maintain an array of wires in essentially the same orientation and spacing as in said top plate, a second plurality of alignment plates has a an array of through holes defined therein, where said array of through holes in each plate of said second plurality of alignment plates consecutively decrease a spatial relationship (gap) of said array of test probe wires until a minimum spatial distance has been achieved, each hole within said array of through holes in said second plurality of alignment plates acts as a singular point on a spline, where said first and second plurality of alignment plates, all in conjunction with each other, create a smooth three dimensional spline for each test probe wire, providing a smooth and kink free motion for each of said test probe wires in said test probe wire array;

d. said second plurality of alignment plates contains a last alignment plate, said last alignment plate has sufficient thickness to provide stability to said test probe wire array, said minimum required spatial relationship of said test probe wire array is defined by the SMC's to be tested;

e. said translating alignment plate assembly also has a first and second alignment bar, said first alignment bar has a first set of parallel slots defined therein, said second alignment bar has a second set of parallel slots defined therein, said first and said second set of parallel slots are designed to rigidly hold a first set of said plurality of alignment plates, said first and said second set of parallel slots in each alignment bar are positionally opposed to each other, a second set of alignment plates each has a plurality of parallel guide rods positioned to rigidly hold said plurality of alignment plates, said positional location of said guide rods is defined by the shape and size of said last of said plurality of alignment plates;

f. said first alignment bar has a first top side and a first bottom side, and said second alignment bar has a second top side and a second bottom side, said first top side of said first alignment bar has a central hole defined therein, and said second top side of said second alignment bar has a central hole defined therein, a first bushing has a first through hole defined therethrough, and a second bushing has a second through hole defined therethrough;

g. a first spacer block has a top side and a bottom side, said first spacer block has a third through hole defined therethrough, where said third through hole penetrates said top side and said bottom side of said first spacer block, said bottom side of said first spacer block has a first groove defined therein, said first groove is adapted to allow said first alignment plate to snugly fit therein;

h. a second spacer block has a top side and a bottom side, said second spacer block has a fourth through hole defined therethrough, where said fourth through hole penetrates said top side and said bottom side of said second spacer block, said bottom side of said second spacer block has a second groove defined therein, said second groove is adapted to allow said first alignment plate to snugly fit therein;

i. said first plurality of alignment plates has a series of through holes defined therein, said series of through holes are positionally opposed to each other and are centrally biased towards the edges of said first plurality of alignment plates, said plurality of through holes have a diameter that allows said first bushing and said second bushing to be positioned therein;

j. a first dowel pin is inserted into said central hole of said first top side of said first alignment bar, said first dowel pin is inserted through said third through hole of said first spacer block, where said top side of said first spacer block bears against said first top side of said first alignment bar, a second dowel pin is inserted through said central hole of said second top side of said second alignment bar, said second dowel pin is inserted through said fourth through hole of said second spacer block, where said top side of said second spacer block bears against said second top side of said second alignment bar, said first dowel pin is inserted through said fifth through hole of said first alignment plate and said second dowel pin through said sixth through hole of said first alignment plate, said first alignment plate is positioned in said first groove of said first spacer block and said second groove of said second spacer block, said first dowel pin is frictionally inserted into said first through hole of the said first bushing positioning said first alignment bar, said second dowel pin is frictionally inserted into said second through hole of said second bushing, positioning said second alignment bar;

k. said bottom plate has a rectangular groove centrally defined therein, said bottom plate has a second groove and a third groove defined therein, said second and said third groove are positionally opposed to each other and allow said first and said second alignment bars to inserted therethrough, said first bottom side of said first alignment bar is shaped to allow a first flat to slide within said second groove of said bottom plate, a second flat of said first alignment bar bears against said bottom plate and acts as a stop for said first alignment bar, said second bottom side of said second alignment bar is shaped to allow a third flat to slide within said third groove of said bottom plate, a fourth flat of said second alignment bar bears against said bottom plate and acts as a stop for said second alignment bar, said ninth alignment plate is essentially rectangular in shape and has four corners, a first and a third guide rod are each located in opposing corners of said ninth alignment plate, a second and a fourth guide rod are each located in opposing corners of said ninth alignment plate, said second and said fourth guide rods are spring loaded and extend beyond said ninth alignment plate and attach to opposing corners of a tenth alignment plate, each guide rod is positioned in a parallel relationship to each other, said first and said third guide rods extend through said second through said ninth alignment plates, while said second and said fourth guide rods extend only through said seventh through said ninth alignment plates, a fifth guide rod is positioned through said second through said sixth alignment plates, said fifth guide rod is axially parallel to said second guide rod, a sixth guide rod is positioned through said second through said sixth alignment plates and is axially parallel to said fourth guide rod, said first, said second, said third, said fourth, said fifth, and said sixth guide rods, provide stiffness to said second through said ninth alignment plates thereby preventing deflection of said alignment plates during a test;

l. a series of bushings is located between each of said first and second plurality of alignment plates said series of bushings is adapted to eliminate gaps between said first and second series of alignment plates, a plurality of countersunk bolts is inserted through said first and second plurality of alignment plates and through said series of bushings and each is adapted to threadably engage in a bushing, locking said alignment plates in a fixed position thereby;

m. a last alignment plate is distally spaced from said last of said second plurality of alignment plates by a series of guide rods, said last alignment plate is located in said same parallel relationship as said first and second plurality of alignment plates and contains an array of through holes defined therein, said array of through holes in said last alignment plate has an identical orientation and parallel relationship array of through holes as said last of said second plurality of alignment plates, providing a consistent method of maintaining said group of test probe wires in said proper orientation within said array;

n. said last alignment plate has a first sub-plate and a second sub-plate, said second sub-plate has a central boss defined thereon, where said central boss is adapted to intimately mate with a connector, said connector being located on a test plate, said central boss on said tenth alignment plate is adapted to mate into a corresponding recess in said connector on said test plate, which is located above the SMC to be tested;

o. whereby when a vacuum is applied to said test plate, said test probe assembly operates using a two stroke system, the vacuum causes said test plate to move towards the SMC, said second and said fourth spring-loaded guide rods have a low enough spring rate to allow said test probe wires to penetrate through said tenth alignment plate and contact said corresponding connectors on the SMC (first stroke), and intimate contact is maintained by said array of spring loaded test probes (second stroke), which has a higher spring rate than said second and said fourth guide rods maintaining intimate electrical contact.

4. The device for testing surface connectors of claim 3, wherein said bottom plate are essentially rectangular in shape and has four corners.

5. The device for testing surface connectors of claim 3, wherein;

a. said plurality of locator holes defined in said top plate is four and is defined as a first, second, third and a fourth locator hole;

b. said plurality of locator holes defined in said bottom plate is four and is defined as a fifth, sixth, seventh, and an eighth locator hole;

c. said first and said fifth locator holes, said second and said sixth locator holes, said third and said seventh locator holes, and said fourth and said eighth locator holes are each positionally opposed to each other on said top plate and said bottom plate.

6. The device for testing surface connectors of claim 3, wherein;

a. said plurality of separator bushings comprises a first, a second, a third and a fourth separator bushing, said first and said third separator bushings and said second and said fourth separator bushings are of equal lengths, said first and said third separator bushings and said second and said third separator bushings bear against each other and define the distance between said top plate and said bottom plate;

b. said top plate bears against said second and said fourth separator bushings, while said bottom plate bears against said first and said third separator bushings;

c. said plurality of separator pins comprise a first separator pin or separator bolt said first separator pin is inserted through said first locator hole in said top plate, through said first and said second separator bushings and is adapted to attach to said fifth locator hole, a third separator pin, said third separator pin is inserted through said third locator hole in said top plate through said third and said fourth separator bushings and is adapted to attach to said seventh locator hole; and d. a second separator pin is frictionally inserted into said second locator hole in said top plate and said sixth locator hole in said bottom plate, a fourth separator pin is frictionally inserted into said fourth locator hole in said top plate and said eighth locator hole in said bottom plate, said first and said third separator bolts are countersunk in said top plate where each said separator pin is located in a corner of said top plate and said bottom plate and provides for angular and distal stability to said test probe assembly.

7. The device for testing surface connectors of claim 3, wherein said array of through holes in said top plate and said bottom plate is rectangular in shape.

8. The device for testing surface connectors of claim 3, wherein;

a. said plurality of alignment plates in said translating alignment plate assembly contains a first, a second, a third, a fourth, a fifth, a sixth, a seventh, an eighth, and a ninth alignment plate, said first alignment plate has a first array of through holes defined therein, and said second alignment plate has a second array of through holes defined therein, where said first and said second array of through holes are parallel and co-incidently positioned and maintain an array of wires in essentially the same orientation and spacing as in said top plate;

b. said third through eighth alignment plates have a third through an eighth array of through holes defined therein, where said third through said eighth array of through holes each consecutively decrease a spatial relationship (gap) of said array of test probe wires until a minimum spatial distance has been achieved, said ninth alignment plate has a ninth array of through holes defined therein, where said ninth array of through holes is arrayed at a minimum required distance, each hole within said first through said ninth array of through holes each acts as a singular point on a spline, where said first through ninth array of through holes, all in conjunction with each other, create a smooth three dimensional spline for each test probe wire, providing a smooth and kink free motion for each of said test probe wires in said test probe wire array.

9. The device for testing surface connectors of claim 8, wherein;

a. said ninth alignment plate has a thickness, said thickness provides stability to said test probe wire array, said minimum required distance of said test probe wire array is defined by the SMC's to be tested; and b. said ninth alignment plate is an assembly comprising a plurality of sub-plates, where each of said plurality of said sub-plates is of the same shape and thickness, each of said plurality of said sub-plates has an array of through holes defined therein, each of said array of through holes are parallel and co-incidently positioned.

10. The device for testing surface connectors of claim 9, wherein said plurality of sub-plates comprises a first sub-plate, a second sub-plate, and a third sub-plate.

11. The device for testing surface connectors of claim 8, wherein;

a. said first plurality of alignment plates is defined as a first and second alignment plates;

b. said second plurality of alignment plates comprises a third through ninth alignment plate; and c. said plurality of guide rods is defined as four, where each guide rod is positioned to rigidly hold said second through seventh alignment plate, said positional location of said guide rods is defined by the shape and size of said eighth, a ninth, and a tenth alignment plate.

12. The device for testing surface connectors of claim 8, wherein said test probe wire has a diameter no greater than 0.008 inch. (0.2032 mm).

* * * * *